(12) United States Patent
Jongren et al.

(10) Patent No.: US 9,729,272 B2
(45) Date of Patent: *Aug. 8, 2017

(54) FEEDBACK WITH UNEQUAL ERROR PROTECTION

(71) Applicant: IDTP HOLDINGS, INC., Wilmington, DE (US)

(72) Inventors: George Jongren, Stockholm (SE); Patrick Svedman, Stockholm (SE); Bo Goransson, Sollentuna (SE)

(73) Assignee: IDTP HOLDINGS, INC., Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 14/828,264

(22) Filed: Aug. 17, 2015

(65) Prior Publication Data

US 2015/0358112 A1 Dec. 10, 2015

Related U.S. Application Data

(63) Continuation of application No. 12/812,259, filed as application No. PCT/SE2008/050958 on Aug. 25, 2008, now Pat. No. 9,112,647.

(60) Provisional application No. 61/020,491, filed on Jan. 11, 2008.

(51) Int. Cl.
*H04L 1/00* (2006.01)
*H03M 13/35* (2006.01)

(52) U.S. Cl.
CPC ........ *H04L 1/0026* (2013.01); *H03M 13/356* (2013.01); *H04L 1/007* (2013.01); *H04L 1/0028* (2013.01); *H04L 1/0041* (2013.01); *H04L 1/0045* (2013.01); *H04L 1/0072* (2013.01)

(58) Field of Classification Search
CPC ..... H04L 1/007; H04L 1/0086; H04L 1/0072; H04L 1/0028; H04L 1/0026
See application file for complete search history.

(56) References Cited

U.S. PATENT DOCUMENTS

| | | | |
|---|---|---|---|
| 6,405,338 B1 | 6/2002 | Sinha et al. |
| 6,665,831 B1 | 12/2003 | Yoshida et al. |
| 7,319,718 B2 | 1/2008 | Roh et al. |
| 7,757,155 B2 | 7/2010 | Lim et al. |
| 8,006,168 B2 | 8/2011 | Reznic et al. |
| 8,078,932 B2 | 12/2011 | Zeira et al. |
| 2001/0048694 A1 | 12/2001 | Banister |
| 2003/0137955 A1 | 7/2003 | Kim et al. |

(Continued)

FOREIGN PATENT DOCUMENTS

| | | | |
|---|---|---|---|
| EP | 1912362 A1 | 4/2008 |
| WO | WO 2006/130033 A1 | 12/2006 |
| WO | WO 2007/015292 A1 | 2/2007 |

OTHER PUBLICATIONS

3rd Generation Partnership Project (3GPP), R1-062650, "Codebook Design for E-UTRA MIMO Pre-Coding", Texas Instruments, TSG RAN WG1 46bis, Seoul, Korea, Oct. 9-13, 2006, 8 pages.

(Continued)

*Primary Examiner* — Steve Nguyen
(74) *Attorney, Agent, or Firm* — Condo Roccia Koptiw LLP

(57) ABSTRACT

Methods and devices provide a feedback message having unequal error protection. The feedback message may include channel quality indicators. The channel quality indicators may have different levels of error protection based on a transmission property.

13 Claims, 15 Drawing Sheets

(56) References Cited

U.S. PATENT DOCUMENTS

2005/0063314 A1    3/2005    Sahinoglu et al.
2009/0092198 A1    4/2009    Motoyoshi et al.

OTHER PUBLICATIONS

3rd Generation Partnership Project (3GPP), R1-070236, "Precoding for E-UTRA Downlink MIMO", LG Electronics, Samsung, NTT-DoCoMo, TSG RAN WG1 Meeting #47bis, Sorrento, Italy, Jan. 15-19, 2007, 3 pages.

3rd Generation Partnership Project (3GPP), R1-073044, "High Delay CDD in Rank Adapted Spatial Multiplexing Mode for LTE DL", Ericsson, TSG-RAN WG1 #49bis, Orlando, USA, Jun. 25-29, 2007, 7 pages.

Boyarinov et al., "Linear Unequal Error Protection Codes", IEEE Transactions on Information Theory, vol. 27, No. 2, Mar. 1981, pp. 168-175.

Lim et al., "CQI Signaling With Unequal Error Protection for OFDMA", C802.16e-03/116, IEEE 802.16 Broadband Wireless Access Working Group, May 2004, pp. 1-9.

Love et al., "Limited Feedback Unitary Precoding for Spatial Multiplexing Systems", IEEE Transactions on Information Theory, vol. 51, No. 8, Aug. 2005, pp. 2967-2976.

Masnick et al., "On Linear Unequal Error Protection Codes", IEEE Transactions on Information Theory, vol. 3, No. 4, Oct. 1967, pp. 600-607.

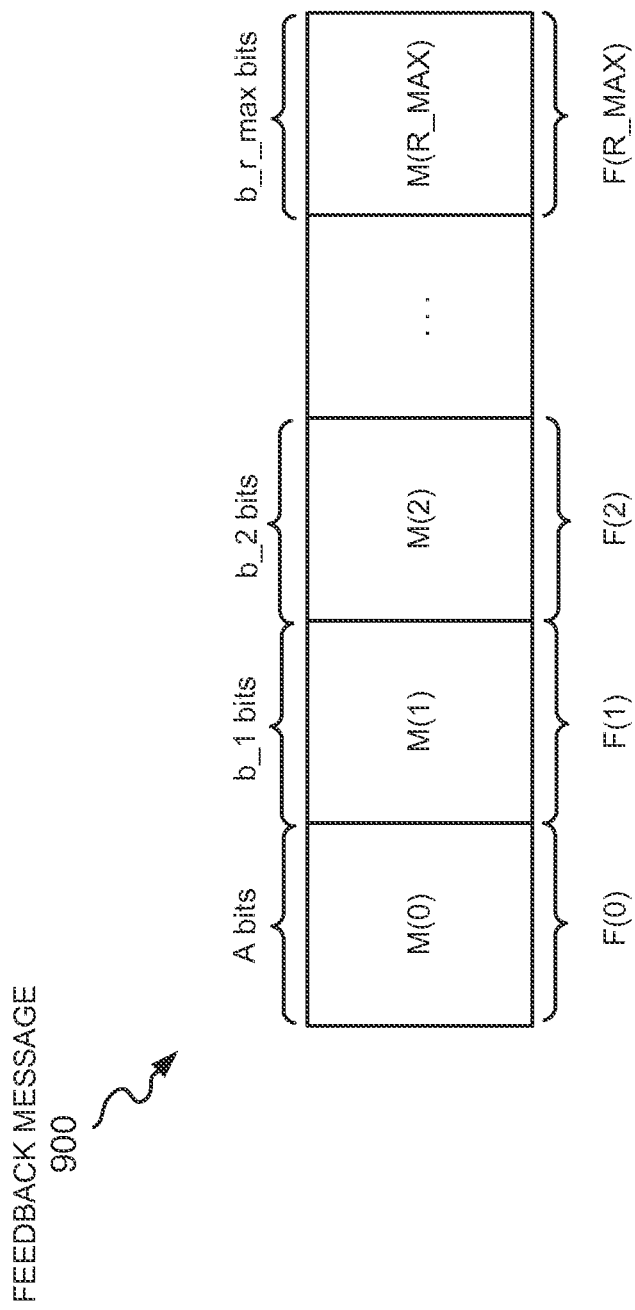

FEEDBACK WITH UNEQUAL ERROR PROTECTION

CROSS-REFERENCE

This application is a continuation of U.S. patent application Ser. No. 12/812,259, which was filed Jul. 9, 2010, which is the 35 U.S.C. §371 National Stage of Patent Cooperation Treaty Application No. PCT/SE08/50958, which was filed Aug. 25, 2008, which claims benefit to U.S. Provisional Application No. 61/020,491, which was filed Jan. 11, 2008, the contents of which are hereby incorporated by reference herein, for all purposes.

TECHNICAL FIELD

Implementations described herein relate generally to feedback schemes having unequal error protection in a communication system.

BACKGROUND

In a communication system, such as in a wireless communication system, two devices may communicate by establishing and maintaining a communication link. For example, a wireless station and user equipment (UE) may communicate. A fundamental aspect to this communication is link adaptation. For example, the wireless station transmits to the UE in a manner tailored to the channel conditions experienced by the UE. The wireless station is able to perform link adaptation based on the UE transmitting to the wireless station one or more feedback messages. The feedback message can include, among other things, channel quality indicators (CQIs). The UE generates the CQIs based on its estimation of existing channel conditions. In a Multiple-Input Multiple-Output (MIMO) communication system, the UE may provide a CQI for each layer (e.g., data stream) of communication.

In existing solutions, however, where per-layer CQI feedback is provided, the UE transmits the feedback message without regard to the content of the feedback message and/or without recognizing relationships between the content of the feedback message, the corresponding channel conditions, and the need for error protection. For example, the UE may transmit the feedback message with inadequate error protection. In this regard, information included in the feedback message may be lost or improperly decoded by the wireless station, which can result in poor communication between the UE and the wireless station. The UE may also transmit the feedback message with an unnecessarily high level of error protection, thereby wasting communication resources.

SUMMARY OF THE INVENTION

It is an object to obviate at least some of the above disadvantages and to improve the operability of devices within a communication system.

According to one aspect, a method for providing feedback by a device associated with a wireless network may be characterized by receiving transmissions via a receiver of the device, generating a feedback message based on the received transmissions, the feedback message may include an ordered set of feedback parts, with each feedback part having a relationship with a transmission property capable of having a range of transmission property values, where a greater transmission property value enables a higher maximum data rate for the potential transmission than a lower transmission property value that enables a lower maximum data rate for the potential transmission, the data rate corresponding to a payload size of the potential transmission, and where the ordered set of feedback parts may be defined such that a lowest value in the range of transmission property values for each of the feedback parts, except a first feedback part in the ordered set of feedback parts, may be greater than a lowest value in the range of transmission property values of a preceding feedback part in the ordered set, and that the relationship between each feedback part and the range of transmission property values being such that one or more of the feedback parts may include information that at least partly predicts a communication performance of the potential transmission with a characteristic corresponding to any of the transmission property values in the range of transmission property values, encoding the feedback message using an unequal error protection code that provides a plurality of levels of error protection, where a level of error protection of each feedback part, except the first feedback part, is lower than or equal to a level of error protection of the preceding feedback part, and the level of error protection is not equal for all feedback parts of the ordered set, and transmitting the encoded feedback message.

According to another aspect, a method for providing link adaptation by a device associated with a wireless network may be characterized by receiving a feedback message encoded with unequal error protection code, the feedback message may include an ordered set of feedback parts, with each feedback part having a relationship with a transmission property capable of having a range of transmission property values, where a level of error protection for each feedback part, except a first feedback part in the ordered set of feedback parts, is lower than or equal to a level of error protection of a preceding feedback part of the ordered set of feedback parts, and the level of error protection is not equal for the ordered set of feedback parts, decoding the feedback message, performing link adaptation for a subsequent transmission based on the decoding of the feedback message, and transmitting the subsequent transmission according to the link adaptation.

According to yet another aspect, a device may be characterized by a transceiver configured to receive transmissions from another device, generate a feedback message including a set of feedback parts, with each feedback part having relationship with a transmission property capable of having a range of transmission property values that correspondingly enable a range of data rates for a potential transmission, and where each of the feedback parts is capable of including information that predicts a communication performance of the potential transmission, and the feedback parts having an order where the order provides lesser error protection to feedback parts that are associated with transmission property values that enable higher data rates and greater error protection to feedback parts that are associated with transmission property values that enable lower data rates, encode the feedback message using an unequal error protection code, where the respective level of error protection for each of the feedback parts is lower than or equal to a preceding feedback part, and transmit the feedback message via an antenna.

According to still another aspect, a wireless station may be characterized by a transceiver configured to receive a feedback message encoded with unequal error protection, the feedback message may include a set of feedback parts, with each feedback part having a range of transmission property values that correspondingly enable a range of data rates for a potential transmission, and the feedback parts have an order where the order provides lesser error protection to feedback parts that are associated with transmission property values that enable higher data rates and greater error protection to feedback parts that are associated with transmission property values that enable lower data rates, decode the feedback message, perform link adaptation for a subsequent transmission based on the decoding, and transmit the subsequent transmission according to the link adaptation.

According to another aspect, a computer-readable medium may contain instructions executable by at least one processor of a device, the computer-readable medium may include one or more instructions for receiving transmissions, one or more instructions for generating a feedback message based on the received transmissions, the feedback message including feedback parts, with each feedback part associated with a transmission property capable of having a range of transmission property values that correspondingly enable a range of data rates for a potential transmission, and where each of the feedback parts is capable of including information that at least partly predicts a communication performance of the potential transmission, and the feedback parts having an order that relates to the range of transmission property values, one or more instructions for encoding the feedback message with an unequal error protection code, where unequal levels of error protection are distributed in the feedback message based on the order of feedback parts such that feedback parts that afford higher data rates are encoded with lower error protection than feedback parts that afford lower data rates, and one or more instructions for transmitting the feedback message.

BRIEF DESCRIPTION OF THE DRAWINGS

FIGS. 9A-9C are diagrams illustrating exemplary feedback messages;

DETAILED DESCRIPTION

Figure 1A:
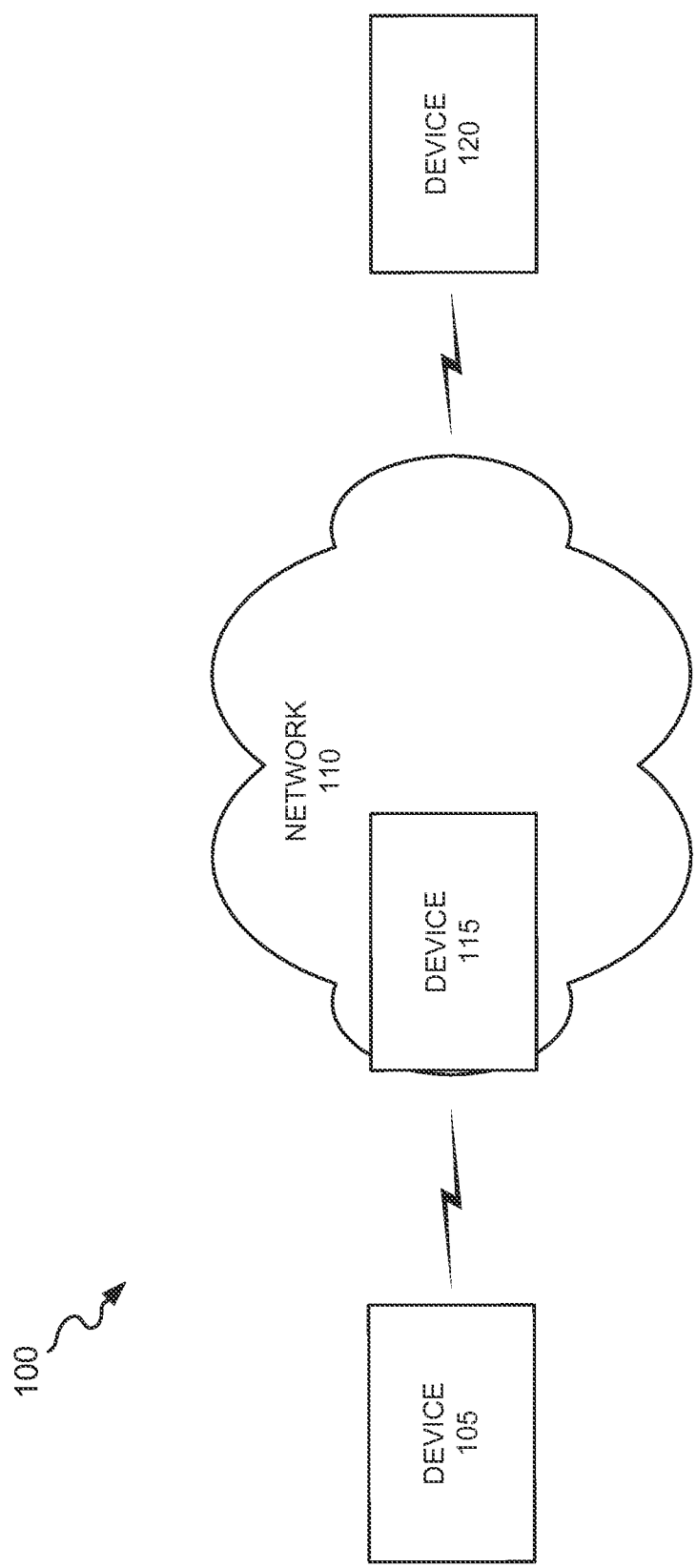
FIGS. 1A and 1B are diagrams illustrating devices communicating with one another via a communication system.

The following detailed description refers to the accompanying drawings. The same reference numbers in different drawings may identify the same or similar elements. Also, the following description does not limit the invention.

The term "may" is used throughout this application and is intended to be interpreted, for example, as "having the potential to," "configured to," or "capable of," and not in a mandatory sense (e.g., as "must"). The terms "a" and "an" are intended to be interpreted to include, for example, one or more items. Where only one item is intended, the term "one" or similar language is used. Further, the phrase "based on" is intended to be interpreted to mean, for example, "based, at least in part, on" unless explicitly stated otherwise. The term "and/or" is intended to be interpreted to include any and all combinations of one or more of the associated list items. The term feedback message and feedback report may be used interchangeably in this description.

The concepts described herein relate to utilizing unequal error protection for improving communication in a communication system, as well as other advantages that may necessarily flow therefrom or are apparent from the description that follows. The communication system is intended to be broadly interpreted to include any type of wireless network, such as a cellular network or a mobile network (e.g., Global System for Mobile Communications (GSM), Long Term Evolution (LTE), Wideband Code Division Multiple Access (WCDMA), Ultra Mobile Broadband (UMB), Universal Mobile Telecommunications Systems (UMTS), Code Division Multiple Access 2000 (CDMA2000), ad hoc networks, High-Speed Packet Access (HSPA), etc.), and non-cellular networks (e.g., Wireless Fidelity (Wi-Fi), Worldwide Interoperability for Microwave Access (Wi-Max), etc.). In this regard, it will be appreciated that the concepts described herein are not platform dependent and may be implemented within a wide variety of communication standards. The terms "communication system" and "network" may be used interchangeably throughout this description.

Embodiments described herein may apply unequal error protection (UEP) to a feedback message in a manner that accounts for channel conditions. As will be described, the feedback message may include feedback parameters having different levels of utility for link adaptation depending on the channel conditions. In one embodiment, the feedback parameters may be encoded with different levels of error protection based on a transmission property (e.g., a transmission rank or the number of carriers). The term transmission rank may correspond to the number of simultaneous layers (e.g., data streams) that a device requests for transmission to itself. The feedback message may include a transmission property value corresponding to the transmission property. In another embodiment, the feedback message may not include a transmission property value corresponding to a transmission property (e.g., a transmission rank or the number of carriers). The feedback message may include feedback parameters having different levels of utility for link adaptation depending on the channel conditions. The feedback parameters may be encoded with different levels of error protection based on the transmission property.

In view of the feedback scheme described herein, a feedback message having a greater degree of reliability under varying channel conditions may be transmitted, which in turn, when received, may improve the ability to perform link adaptation and provide an enhanced quality of service to end users.

For purposes of discussion, a MIMO communication system (e.g., LTE) will be described herein. It will be appreciated that concepts described herein are not dependent on employing this particular type of communication system.

FIG. 1A is a diagram illustrating an exemplary communication system 100 in which the concepts described herein may be implemented. As illustrated, communication system 100 may include a device 105, a network 110 that may include a device 115, and a device 120. A device may include, for example, a base station, UE, a repeater, a gateway, a relay, a combination thereof, or any other type of device that has communication capabilities. Device 105 may be communicatively coupled to device 120 via device 115 and/or network 110. Devices 105, 115 and/or 120 may perform link adaptation and/or may generate feedback messages according to the concepts described herein.

Figure 1B:
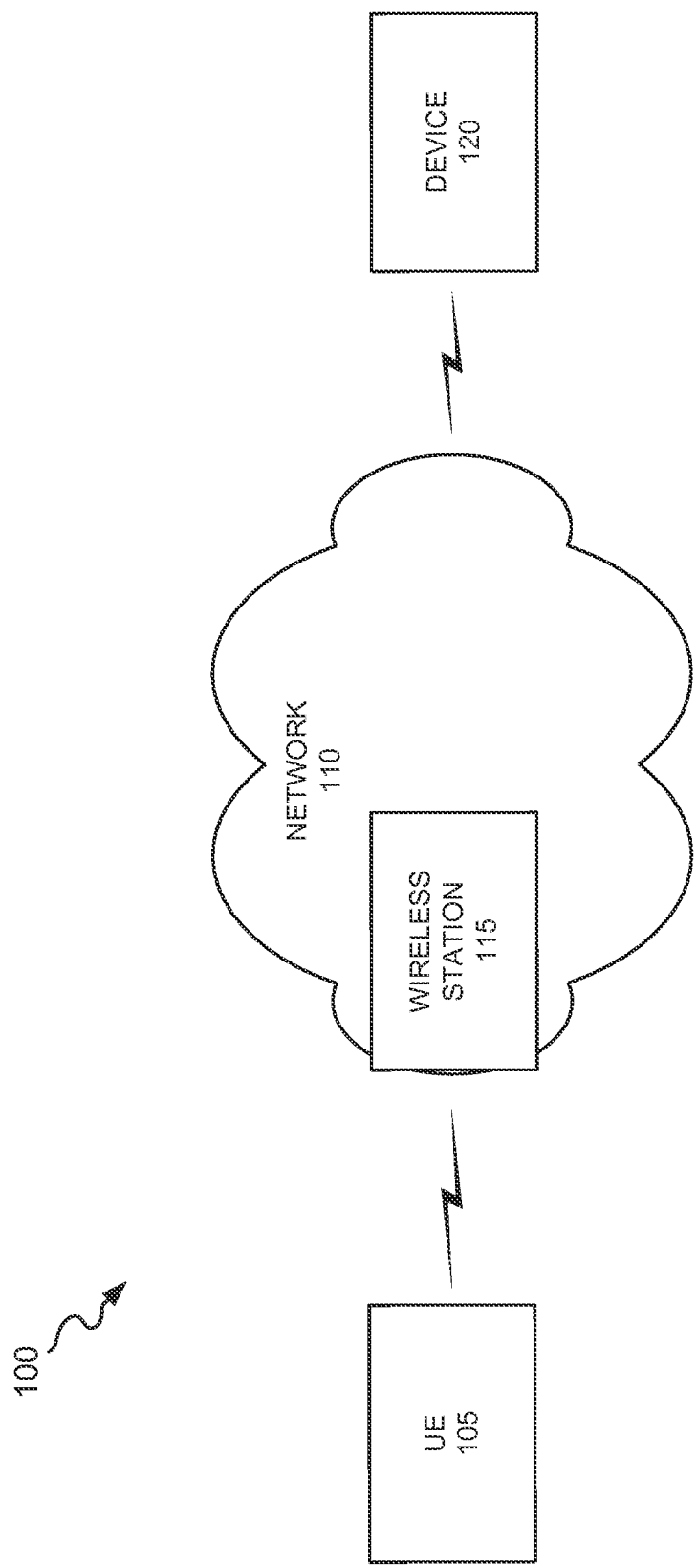

Since the concepts described herein are not dependent on the type of particular devices in communication system 100, for purposes of discussion, communication system 100 will be described based on the exemplary devices illustrated in FIG. 1B. FIG. 1B illustrates a UE 105, network 110, a wireless station 115 and device 120. UE 105 may be communicatively coupled to device 120 via network 110. For example, UE 105 may be communicatively coupled with device 120 via wireless 115 of network 110.

UE 105 may include a device having communication capability and configured to apply UEP to transmitted communications. For example, UE 105 may include a telephone, a computer, a personal digital assistant (PDA), a gaming device, a music playing device, a video playing device, a web browser, a personal communication system (PCS) terminal, a pervasive computing device, and/or some other type of user device configured to perform one or more of the functions associated with the concepts described herein. The capabilities of UE 105 will be described in greater detail below.

Network 110 may include, in addition to wireless station 115, one or more networks of any type, including a wireless network or a wired network. For example, network 110 may include a local area network (LAN), a wide area network (WAN), a telephone network, such as the Public Switched Telephone Network (PSTN) or a Public Land Mobile Network (PLMN), a satellite network, an intranet, the Internet, or a combination of networks or communication systems. In other instances, network 115 may only include wireless station 115.

Wireless station 115 may include a device having communication capability and configured to decode UEP received communications. The term "wireless station" is intended to be broadly interpreted to include any type of device that may communicate with UE 105 via a wireless link. For example, a wireless station may include a base station (BS), a base station transceiver (BTS) (e.g., in a GSM communication system), an eNodeB (e.g., in a LTE communication system), a Node B (e.g., in a UMTS communication system), a repeater, a relay, or some other type of device configured to perform one or more of the functions associated with the concepts described herein. The capabilities of wireless station 115 will be described in greater detail below.

Device 120 may include a device having communication capability. For example, device 120 may include a UE, a server that provides resources and/or services, and/or some other type of device capable of maintaining end-to-end communication with UE 105 via wireless station 115.

Figure 2:
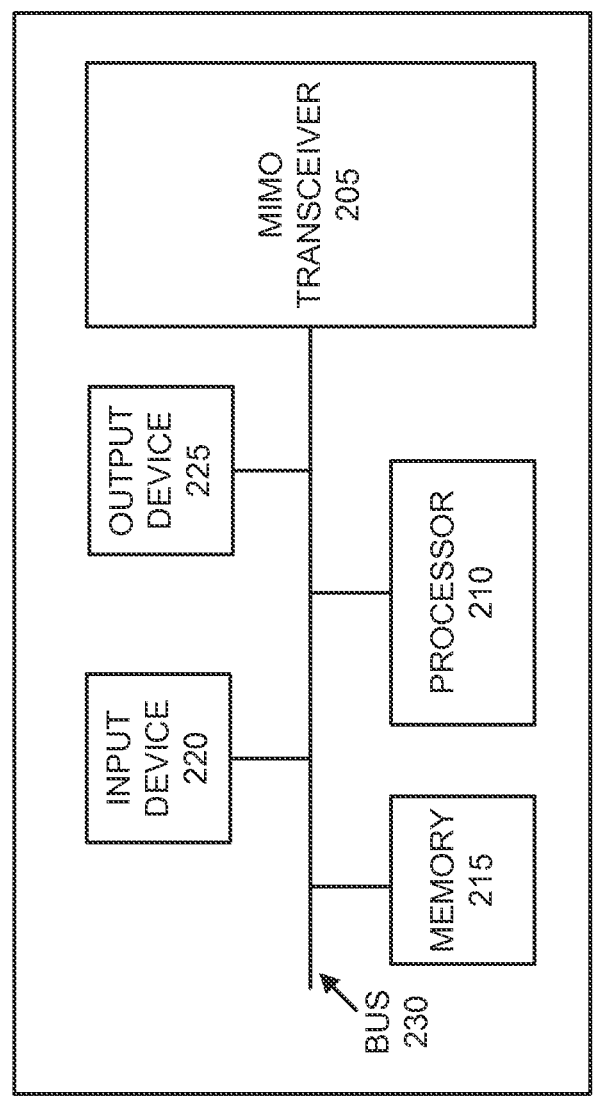
FIG. 2 is a diagram illustrating exemplary components of the UE in FIG. 1.

FIG. 2 is a diagram illustrating exemplary components of UE 105. As illustrated, UE 105 may include a MIMO transceiver 205, a processor 210, a memory 215, an input device 220, an output device 225, and a bus 230. The term "component," as used herein, is intended to be broadly interpreted to include, for example, hardware, software and hardware, firmware, etc.

MIMO transceiver 205 may include a component capable of transmitting and/or receiving information over radio frequency channels via multiple antennas (not illustrated).

Processor 210 may include a component capable of interpreting and/or executing instructions. For example, processor 210 may include, a general-purpose processor, a microprocessor, a data processor, a co-processor, a network processor, an application specific integrated circuit (ASIC), a controller, a programmable logic device, a chipset, and/or a field programmable gate array (FPGA).

Memory 215 may include a component capable of storing information (e.g., data and/or instructions). For example, memory 215 may include a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Input device 220 may include a component capable of receiving an input from a user and/or another device. For example, input device 220 may include a keyboard, a keypad, a mouse, a button, a switch, a microphone, a display, and/or voice recognition logic.

Output device 225 may include a component capable of outputting information to a user and/or another device. For example, output device 225 may include a display, a speaker, one or more light emitting diodes (LEDs), a vibrator, and/or some other type of visual, auditory, and/or tactile output device.

Bus 230 may include a component capable of providing communication between and/or among the components of UE 105. For example, bus 230 may include a system bus, an address bus, a data bus, and/or a control bus. Bus 230 may also include bus drivers, bus arbiters, bus interfaces, and/or clocks.

Although FIG. 2 illustrates exemplary components of UE 105, in other implementations, UE 105 may include fewer, additional, and/or different components than those depicted in FIG. 2. For example, UE 105 may include a hard disk or some other type of computer-readable medium along with a corresponding drive. The term "computer-readable medium," as used herein, is intended to be broadly interpreted to include a physical or a logical storing device. It will be appreciated that one or more components of UE 105 may be capable of performing one or more other tasks associated with one or more other components of UE 105.

Figure 3:
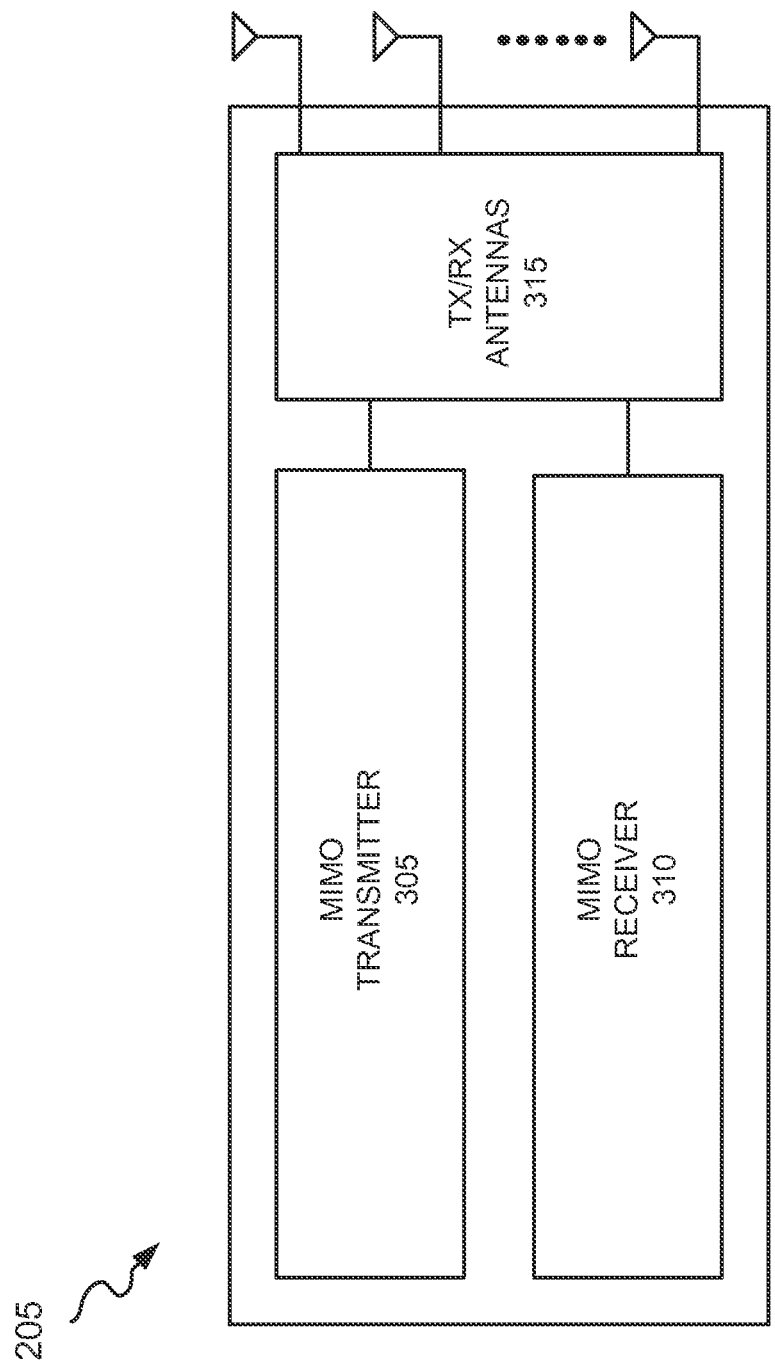
FIG. 3 is a diagram illustrating an exemplary components of the Multiple-Input Multiple-Output (MIMO) transceiver of the UE in FIG. 1.

FIG. 3 is a diagram of exemplary components of MIMO transceiver 205. As illustrated, MIMO transceiver 205 may include a MIMO transmitter 305, a MIMO receiver 310, and transmit/receive (TX/RX) antennas 315. MIMO transmitter 305 may include a component capable of transmitting information over radio frequency channels via TX/RX antennas 315. MIMO receiver 310 may include a component capable of receiving information over radio frequency channels via TX/RX antennas 315. TX/RX antennas 315 may include multiple antennas capable of receiving information and transmitting information via radio frequency channels. TX/RX antennas 315 may be communicatively coupled to MIMO transmitter 305 and MIMO receiver 310.

Although FIG. 3 illustrates exemplary components of transceiver 205, in other implementations, transceiver 205 may include fewer, additional, or different components than those depicted in FIG. 3.

Figure 4:
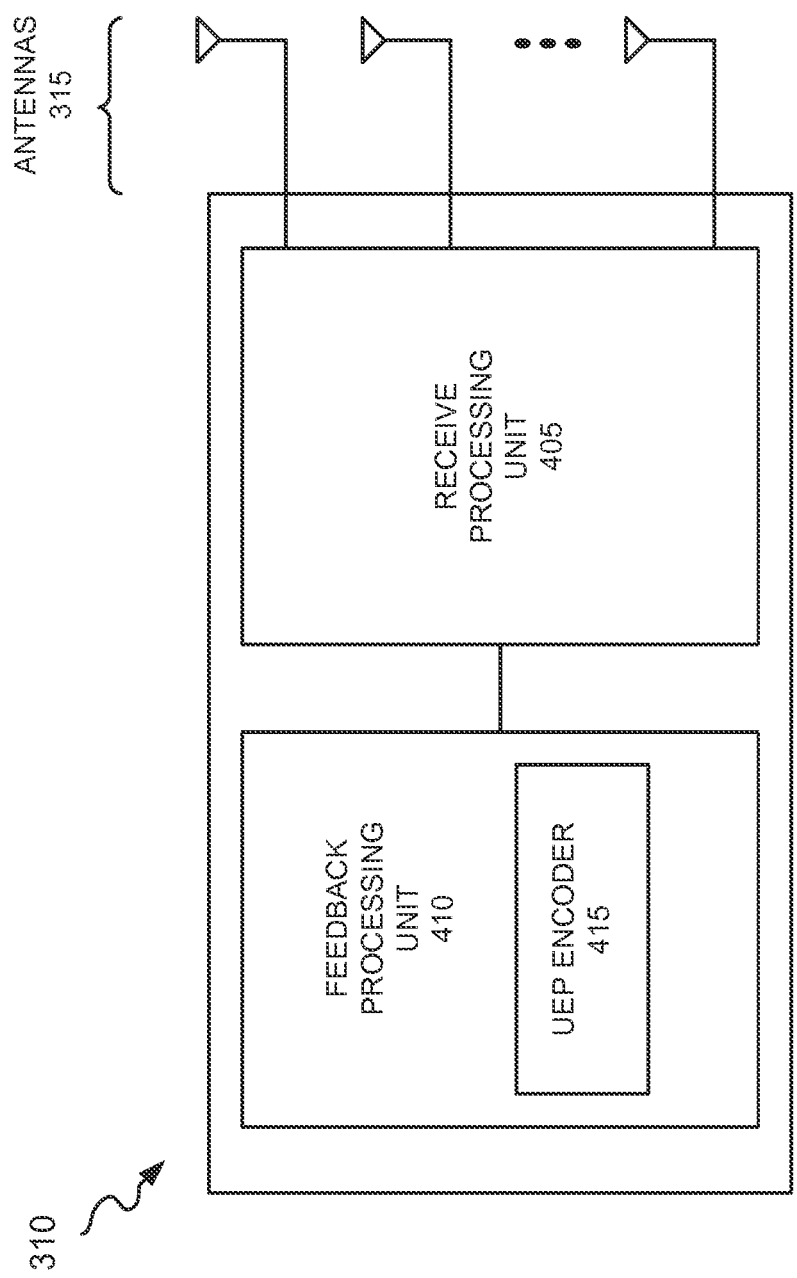
FIG. 4 is a diagram illustrating exemplary components of the MIMO receiver of the UE in FIG. 1.

FIG. 4 is a diagram of exemplary components of MIMO receiver 310 of UE 105. As illustrated, MIMO receiver 310 may include a receive processing unit 405 and a feedback processing unit 410 that includes a UEP encoder 415.

Receive processing unit 405 may include a component capable of processing received information. For example, receiving processing unit 405 may be capable of demodulating, de-interleaving, de-multiplexing, equalizing, filtering, decoding, etc., received information over radio frequency channels.

Feedback processing unit 410 may include a component capable of performing, among other things, channel estimation, transmission rank recommendation or command, and CQI calculation. Feedback processing unit 410 may generate a feedback message. The feedback message may include information for link adaptation to be performed by wireless station 115.

UEP encoder 415 may include a component capable of applying UEP to the feedback message. Feedback processing unit 410 may be communicatively coupled to MIMO transmitter 305 so that the feedback message may be transmitted.

Although FIG. 4 illustrates exemplary components of MIMO receiver 310, in other implementations, MIMO receiver 310 may include fewer, additional, or different components than those depicted in FIG. 4. For example, feedback processing unit 410 and/or UEP encoder 415 may be included with MIMO transmitter 305.

Figure 5:
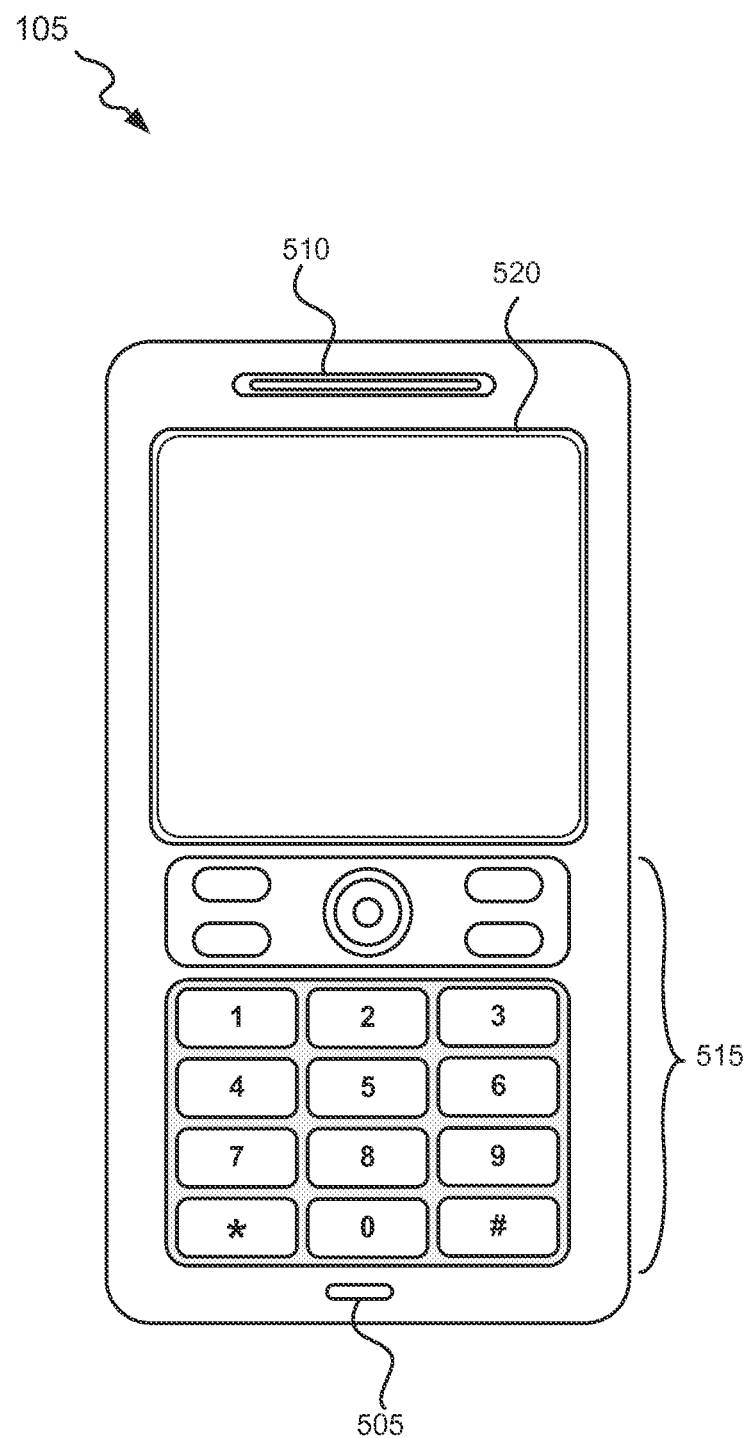
FIG. 5 is a diagram illustrating an exemplary implementation of the UE in FIG. 1, where the UE includes a radio telephone.

FIG. 5 is a diagram illustrating an exemplary implementation of UE 105, where UE 105 includes a radiotelephone. As illustrated, UE 105 may include a microphone 505 (e.g., of input device 220) for entering audio information, a speaker 510 (e.g., of output device 225) for outputting audio information, a keypad 515 (e.g., of input device 220) for entering information or selecting functions, and a display 520 (e.g., of input device 220 and/or output device 225) for outputting visual information and/or inputting information, selecting functions, etc.

Although FIG. 5 illustrates an exemplary implementation of UE 105, in other implementations, UE 105 may include fewer, additional, or different exemplary components.

Figure 6:
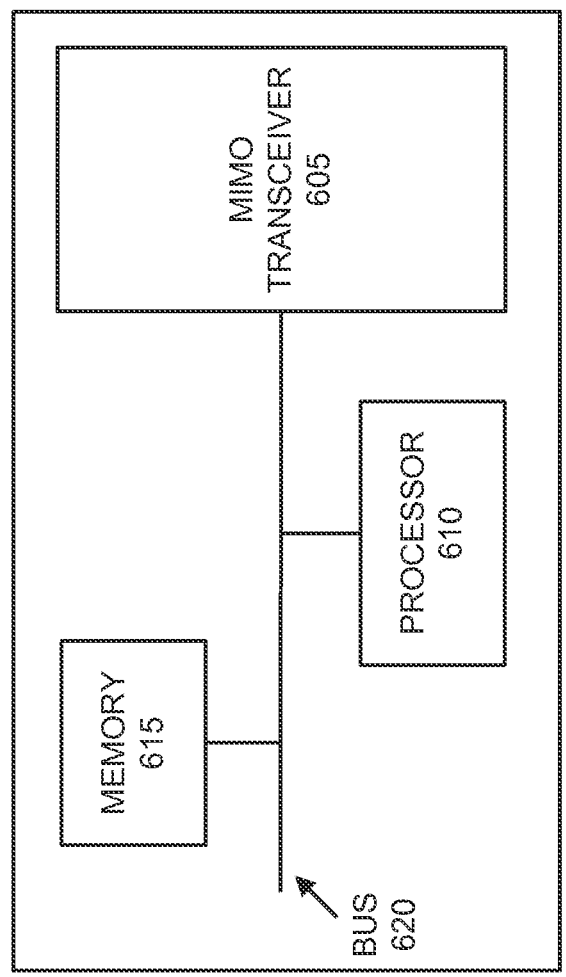
FIG. 6 is a diagram illustrating exemplary components of the device in FIG. 1.

FIG. 6 is a diagram illustrating exemplary components of wireless station 115. Device 120 may be similarly configured or configured similar to that of UE 105. As illustrated, wireless station 115 may include a MIMO transceiver 605, a processor 610, a memory 615, and a bus 620.

MIMO transceiver 605 may include a component capable of transmitting and/or receiving information over radio frequency channels via multiple antennas (not illustrated). Processor 610 may include a component capable of interpreting and/or executing instructions. For example, processor 610 may include, a general-purpose processor, a microprocessor, a data processor, a co-processor, a network processor, an application specific integrated circuit (ASIC), a controller, a programmable logic device, a chipset, and/or a field programmable gate array (FPGA). Memory 615 may include a component capable of storing information (e.g., data and/or instructions). For example, memory 615 may include a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Bus 620 may include a component capable of providing communication between and/or among the components of wireless station 115. For example, bus 620 may include a system bus, an address bus, a data bus, and/or a control bus. Bus 620 may also include bus drivers, bus arbiters, bus interfaces, and/or clocks.

Although FIG. 6 illustrates exemplary components of wireless station 115, in other implementations, wireless station 115 may include fewer, additional, and/or different components than those depicted in FIG. 6. It will be appreciated that one or more components of wireless station 115 may be capable of performing one or more other tasks associated with one or more other components of wireless station 115.

Figure 7:
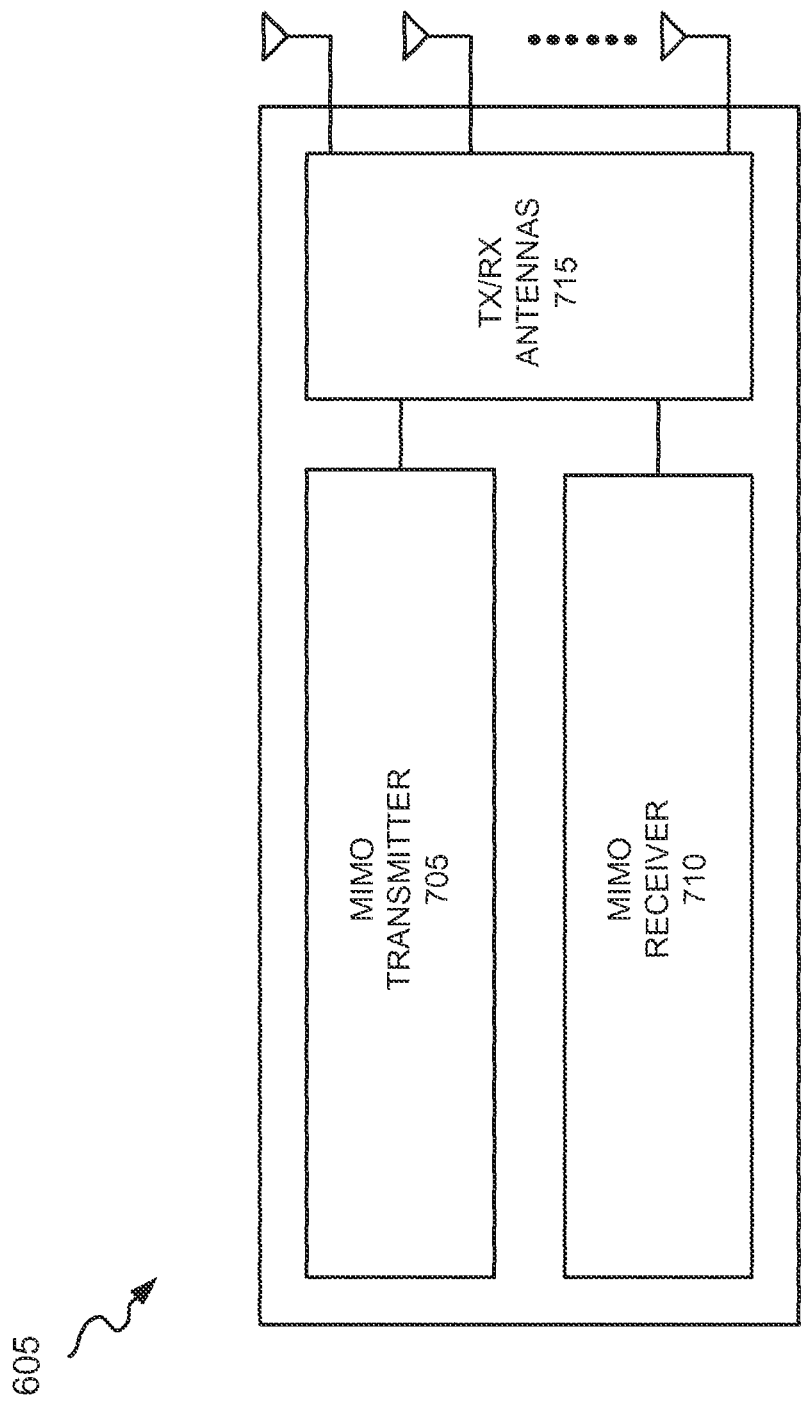
FIG. 7 is a diagram illustrating exemplary components of the MIMO transceiver of the device in FIG. 1.

FIG. 7 is a diagram of exemplary components of MIMO transceiver 605 of wireless station 115. As illustrated, MIMO transceiver 605 may include a MIMO transmitter 705, a MIMO receiver 710, and TX/RX antennas 715. MIMO transmitter 705 may include a component capable of transmitting information over radio frequency channels via TX/RX antennas 715. MIMO receiver 710 may include a component capable of receiving information over radio frequency channels via TX/RX antennas 715. TX/RX antennas 715 may include multiple antennas capable of receiving information and transmitting information via radio frequency channels. TX/RX antennas 715 may be communicatively coupled to MIMO transmitter 705 and MIMO receiver 710.

Although FIG. 7 illustrates exemplary components of transceiver 605, in other implementations, transceiver 605 may include fewer, additional, or different components than those depicted in FIG. 7.

Figure 8:
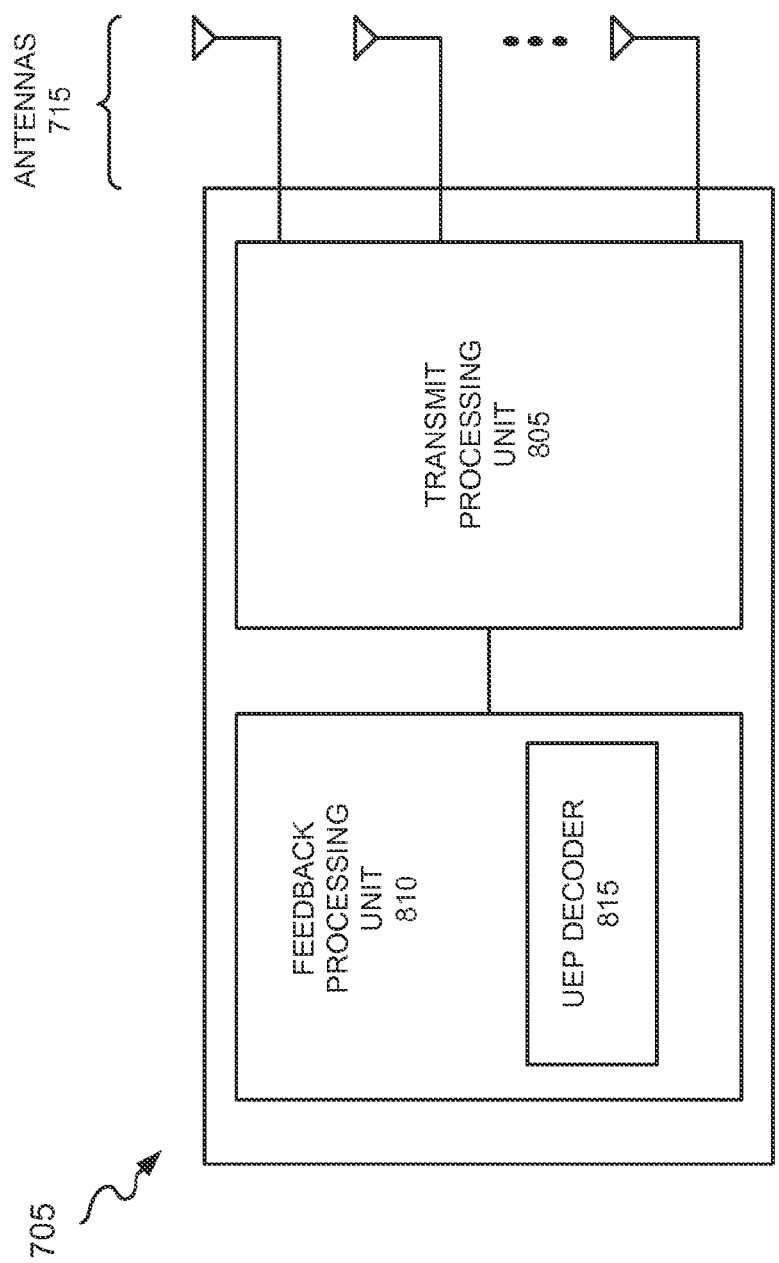
FIG. 8 is a diagram illustrating exemplary components of the MIMO transmitter of the device in FIG. 1.

FIG. 8 is a diagram of exemplary components of MIMO transmitter 705. As illustrated, MIMO transmitter 705 may include a transmit processing unit 805 and a feedback processing unit 810 that includes a UEP decoder 815.

Transmit processing unit 805 may include a component capable of processing information for transmission. For example, transmit processing unit 805 may be capable of modulating, interleaving, multiplexing, equalizing, filtering, encoding, etc., information to be transmitted. Transmit processing unit 805 may be capable of performing link adaptation based on an interpretation of received feedback messages.

Feedback processing unit 810 may include a component capable of interpreting the feedback message. Feedback processing unit 810 may be communicatively coupled to MIMO receiver 710 to receive the feedback message for interpretation.

UEP decoder 815 may include a component capable of decoding the UEP applied to the feedback message.

Although FIG. 8 illustrates exemplary components of MIMO transmitter 705, in other implementations, MIMO transmitter 705 may include fewer, additional, or different components than those depicted in FIG. 8. For example, feedback processing unit 810 and/or UEP decoder 815 may be included with MIMO receiver 710.

As previously mentioned above, UE 105 may generate a feedback message and transmit the feedback message to wireless station 115. Wireless station 115 may perform link adaptation based on the feedback message received. The term "feedback message," as used herein, is intended to be broadly interpreted to include any type of data transmission/reception unit including a datagram, a packet, a frame, a cell, or a block. Described below is an exemplary feedback message having UEP. For purposes of discussion, it is assumed that UE 105 generates the feedback message having a fixed length. However, in other implementations, this may not be the case. For example, UE 105 may generate the feedback message having a variable length based on, for example, the channel conditions. That is, where channel path loss is high and transmission rank is low, the feedback message may include fewer CQIs and correspondingly be of a smaller length compared to when channel path loss is low, transmission rank is high and a greater number of CQIs may be included in the feedback message. However, even still, unequal error protection may still be applied according to the concepts described herein.

FIG. 9A is a diagram illustrating an exemplary feedback message 900. As illustrated, feedback message 900 may include parts M(0) through M(r_max). An M part may include feedback parameters. For example, a feedback parameter may include a transmission recommendation or a transmission command A transmission recommendation or a transmission command may include CQIs, and/or other types of transmission characteristic information. The feedback message may additionally include other parameters and/or feedback parts, for instance a transmission property value, e.g. transmission rank. The term transmission rank, may include, for example, the number of simultaneous data streams or layers that UE 105 recommends and commands to be transmitted to itself.

It will be appreciated that while it is assumed that UE 105 may generate feedback message 900 having a fixed length, parts M(0) through M(r_max) may not each contain a feedback parameter. For example, if feedback processing unit 410 of UE 105 determines a transmission rank of 1, feedback processing unit 410 may calculate a CQI for only one layer (e.g., part M(0)). That is, parts M(1) through M(r_max) may not contain useful information for purposes of link adaptation. For example, parts M(1) through M(r_max) may contain garbage values. In this regard, these values would not be useful for purposes of performing link adaptation. In other implementations, this may not be the case. For example, when feedback message 900 is of a variable length, garbage values may not be present. Further, the feedback message 900 may contain CQIs for more than one transmission rank and omitting the transmission rank recommendation or command, thereby leaving the transmission rank choice completely to the wireless station.

UEP encoder 415 may encode feedback message 900 with UEP. As illustrated, each M part of feedback message 900 may have a corresponding level of error protection (e.g., F(0) through F(r_max)). For example, the error protection levels for F(0) through F(r_max) may correspond to F(0)>F(1) . . . >F(r_max). That is, part M(0) may have a higher level of error protection than part M(1), part M(2) may have a higher level of error protection than part M(3), etc. An M part having a higher level of error protection than another M part may provide a greater likelihood that information bits in the M part will be decoded correctly when random errors occur during transmission. In other implementations, the levels of error protection for parts M(0) through M(r_max) may be distributed differently depending on, among other things, the feedback parameters contained therein.

One example of a transmission property is transmission rank. Typically, when channel path loss is high (e.g., a low signal-to-noise ratio (SNR), signal-to-interference ratio (SIR), signal-to-interference-plus-noise ratio (SINR), etc.,) the transmission rank is low. Other factors may be indicative of a low transmission rank, such as geometry (e.g., distance to wireless station 115), and/or other types of channel state information, such as reciprocal channel parameters (i.e., parameters that are substantially correlated between the uplink and the downlink of UE 105). For example, a low geometry may translate to a stronger interference (e.g., low SIR). Conversely, when channel path loss is low, the transmission rank is typically high. In this regard, unlike existing feedback schemes, it would be advantageous to exploit the relationship that exists between the transmission rank and the levels of error protection applied to the M parts of feedback message 900. That is, UEP may be applied to feedback message 900 so that M parts containing (useful) information may be provided with a higher level of error protection than M parts not containing (useful) information.

Based on these assumptions and/or relationships described, when UE 105 recommends or commands a low transmission rank, there is typically a need for a higher level of error protection in feedback message 900 than when UE 105 recommends or commands a high transmission rank. Therefore, the feedback parts having a relationship with a low transmission rank need a higher level of error protection in the feedback message than the feedback parts having a relationship with a high transmission rank. For example, if feedback part M(0) is related to transmission rank 1 and M(1) is related to transmission rank 2, then M(0) needs a higher level of error protection than M(1). Thus, by applying an UEP coding scheme with feedback message 900, the average error probability of useful feedback parts may be minimized.

Based on these concepts, information bits of an (M) part corresponding to a single rank transmission may be afforded the highest level of error protection in feedback message 900. It will be appreciated, however, that feedback message 900 may contain a single CQI when the transmission rank is greater than 1. For example, if UE 105 includes a linear MIMO receiver and employs large delay cyclic delay diversity (CDD), the effective CQIs for all used layers may be identical since the data (e.g., symbols) from each layer may be interleaved across all used spatial dimensions. However, if UE 105 includes a successive interference cancellation (SIC) type of receiver, the CQIs of subsequently decoded layers may increase. Thus, there may be a need for multiple CQIs and UEP.

Figure 9B:
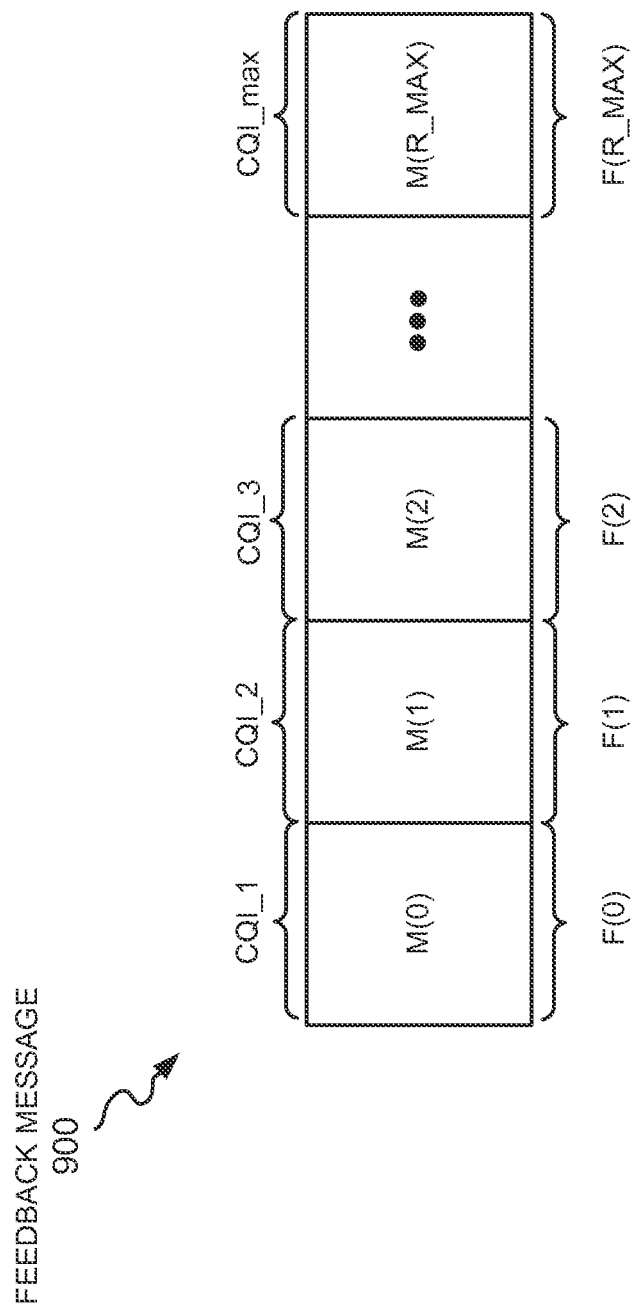

FIG. 9B is a diagram illustrating feedback message 900 that includes exemplary feedback parts. Parts M(0) through M(r_max) may each include a CQI or a garbage value based on the transmission property value. The transmission property value may be included in the feedback message 900. For example, if the transmission property is transmission rank and the transmission rank value is 1, part M(0) may include a CQI for a stream 1 corresponding to transmission rank 1, and parts M(1) through M(r_max) may include garbage values. In another case, feedback message 900 may include a transmission rank value of 2. In such an instance, part M(0) may include a CQI for stream 1 corresponding to transmission rank 2 and part M(1) may include a CQI for stream 2 corresponding to transmission rank 2. Parts M(2) through M(r_max) may include garbage values. Thus, in such a feedback scheme, the content of parts M(0) through M(r_max) may be based on a transmission property value (e.g., transmission rank, number of carriers, etc.). It will be appreciated garbage values may not be included with feedback message 900 when, for example, feedback message 900 is of a variable length. The feedback part content for higher transmission rank values is analogous. In the example of FIG. 9B, M(0) is associated with the range of transmission property (rank) values 1, 2, . . . , (r_max+1), since the content of the feedback part is applicable for all these values of the transmission property. Similarly, M(1) is associated with the range of values 2, 3, . . . , (r_max+1), etc., for M(i) with i=2, . . . , r_max. This exemplifies an ordered set of feedback parts, since the lowest value in the range of transmission property values for M(0), i.e. 1, is lower than the lowest value in the range of property values for M(1), i.e., 2, and so on for the subsequent feedback parts.

Figure 9C:
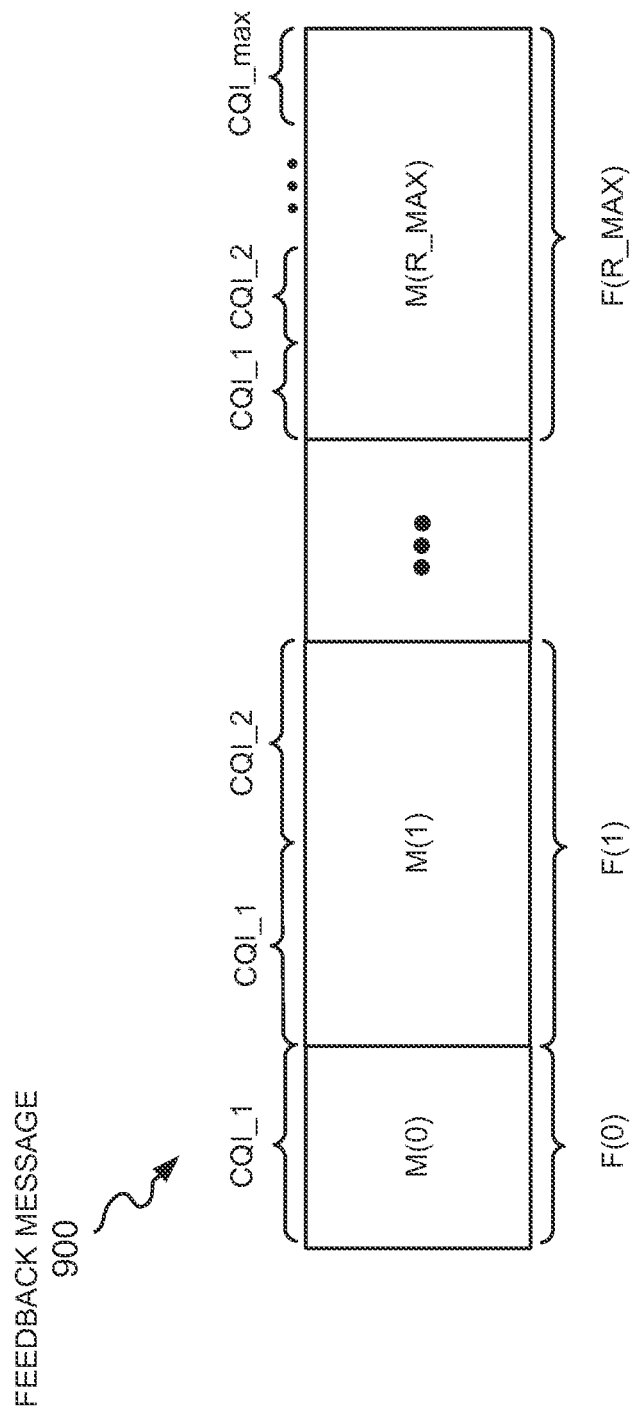

FIG. 9C is a diagram illustrating feedback message 900 including another set of exemplary feedback parameters. However, in contradistinction to FIG. 9B, feedback message 900 may not include a transmission property value (e.g., transmission rank, number of carriers, etc.). Nevertheless, the content of parts M(0) through M(r_max) may be based on the transmission property. For example, assume UE 105 provides CQI recommendations for transmission ranks 1 and 2 (i.e. r_max=1). In such an instance, part M(0) may include a CQI for a stream 1 associated with a transmission rank of 1, and part M(1) may include a CQI for a stream 1 and a CQI for a stream 2, that may be associated with a transmission rank of 2. In this example, wireless station 115 may choose between using transmission rank 1 or transmission rank 2 since it has CQIs for both cases available through feedback message 900. In this example, M(0) is associated with the range of transmission rank values 1 (e.g., the range contains only one value), since the content of M(0) is applicable only for a rank 1 transmission. Similarly, M(1) is associated with the range of transmission rank values 2 (e.g., the range contains only one value), since the content of M(1) is applicable only for rank 2 transmission. This exemplifies an ordered set of feedback parts, since the lowest value in the range of transmission property values for M(0), i.e. 1, is lower than the lowest value in the range of transmission property values for M(1), i.e. 2.

While feedback message 900 has been described in reference to CQIs for different layers, the concepts described herein have broader application. For example, UEP may be applied to any feedback parameter that may be reported on a per-layer basis. Thus, any feedback parameter that may be considered more important when, for example, the channel path loss is high, may be afforded a higher level of error protection than other feedback parameters. Similarly, any feedback parameter that may be considered less important when, for example, the channel path loss is low, may be afforded a lower level of error protection than other feedback parameters.

Although FIGS. 9A-9C illustrate an exemplary feedback message 900, in other implementations, feedback message 900 may include additional, different, or fewer feedback parameters and/or feedback parts than those described. Additionally, or alternatively, in other implementations, the distribution of unequal error protection may be different.

Figure 10:
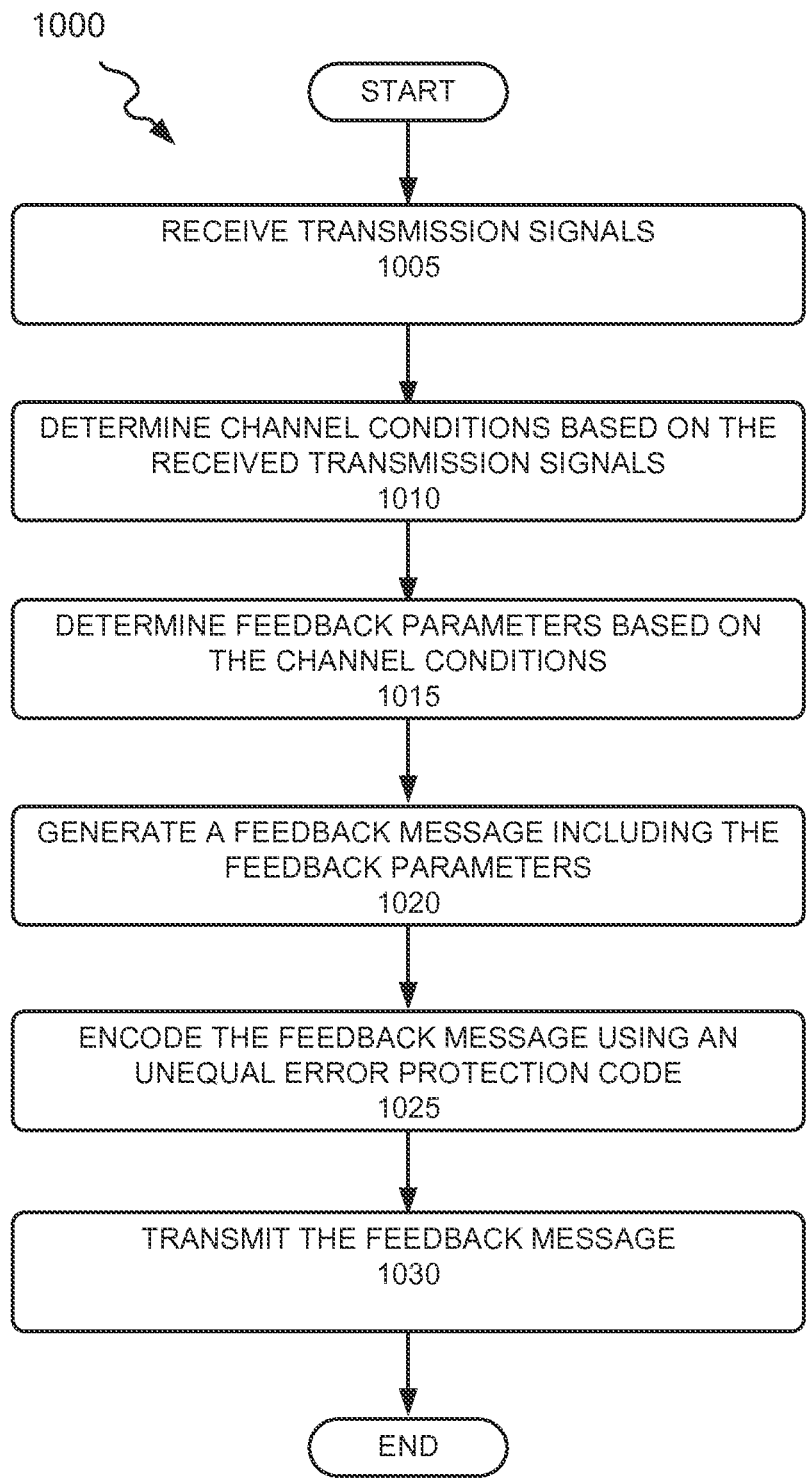
FIGS. 10 and 11 are flow diagrams illustrating exemplary processes associated with the concepts described herein.
Figure 11:
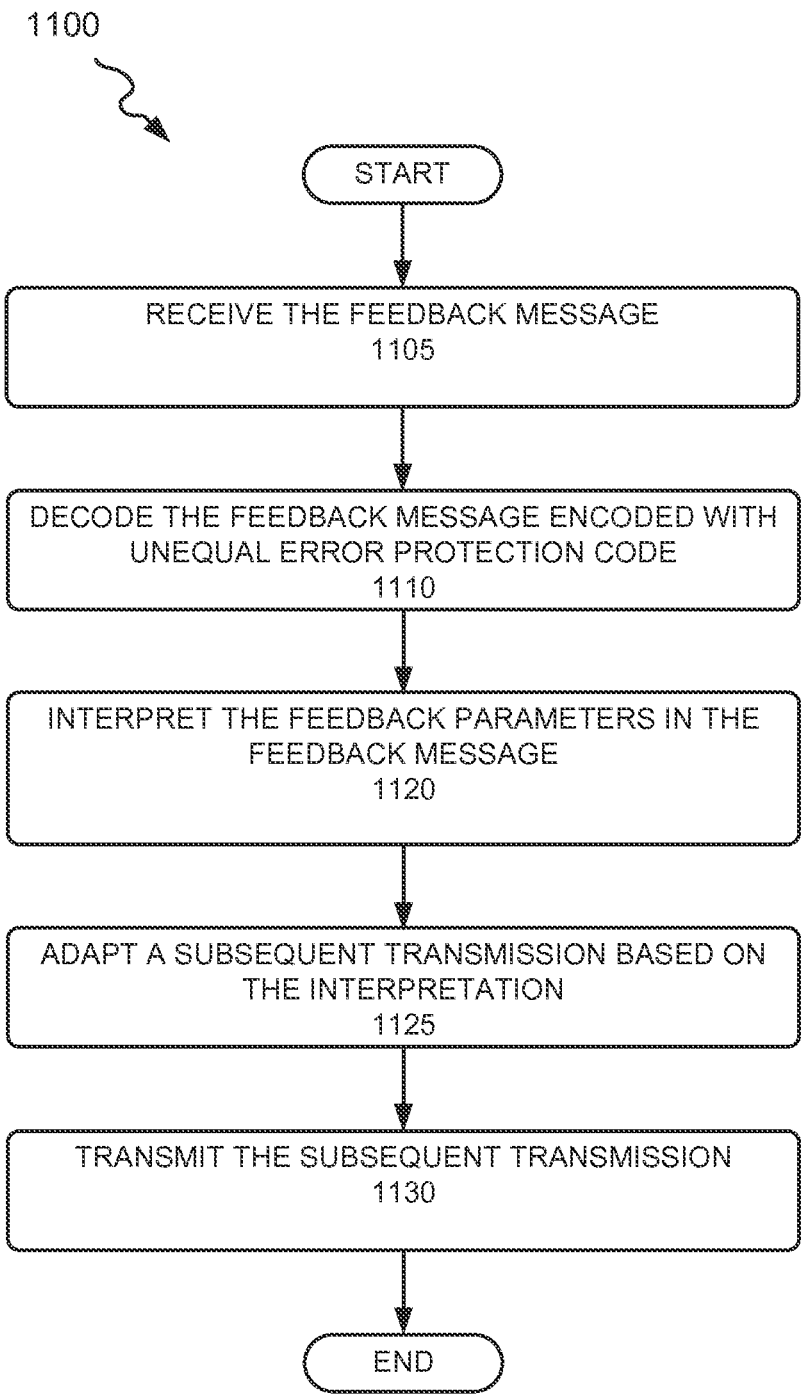
Figure 12:
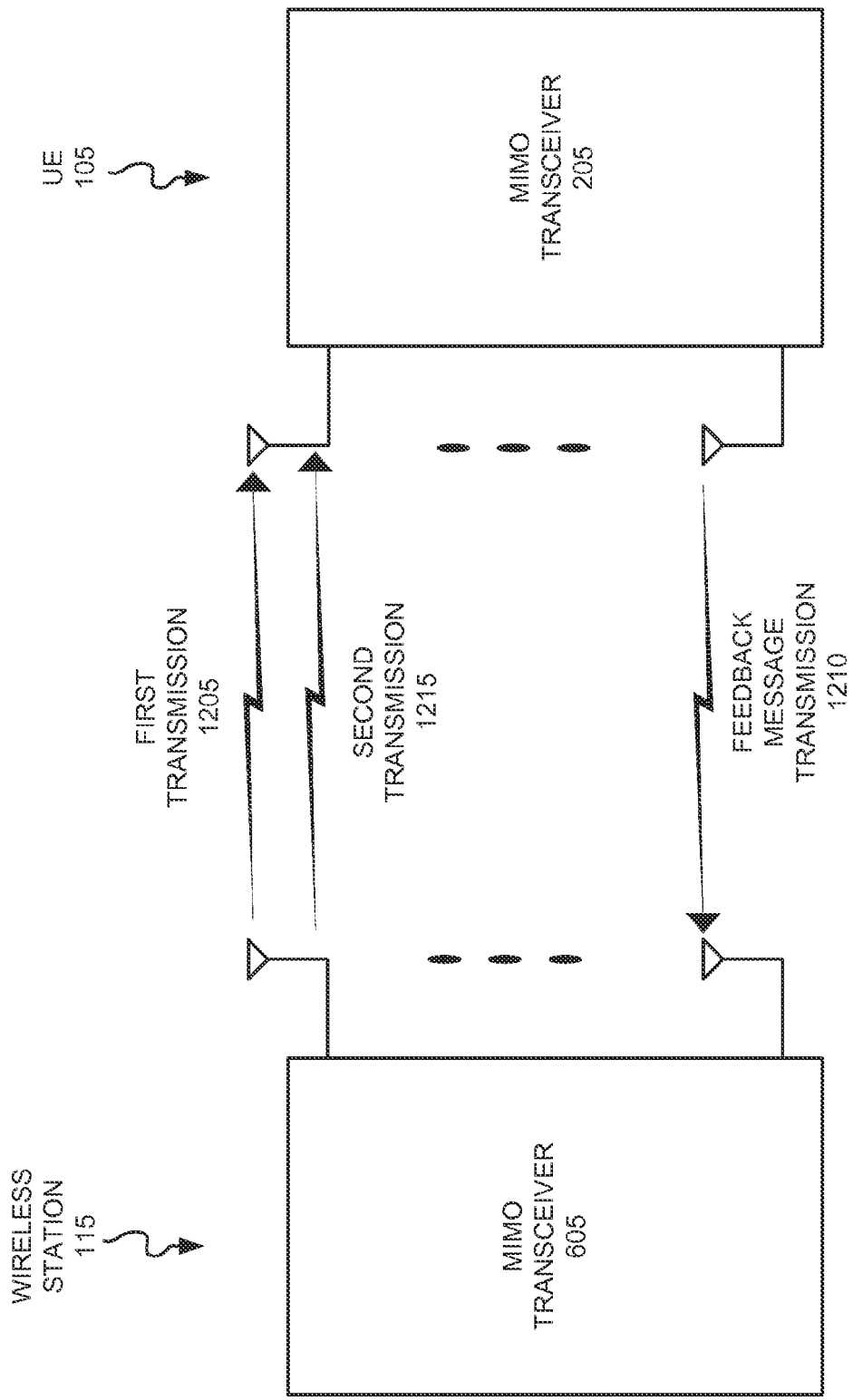
FIG. 12 is a diagram illustrating exemplary communications exchanged between the UE and the device.

FIGS. 10-12 relate to exemplary processes that may be associated with the concepts described herein. FIG. 10 illustrates an exemplary process that may be performed by UE 105 for generating feedback message 900. FIG. 11 illustrates an exemplary process that may be performed by wireless station 115 for link adaptation based on feedback message 900. FIG. 12 illustrates an exemplary exchange of transmissions between UE 105 and wireless station 115 which include feedback message 900.

FIG. 10 is a flow diagram illustrating an exemplary process 1000 that may be employed for generating feedback message 900. Process 1000 may begin with receiving transmission signals (block 1005). For example, referring to FIG. 12, wireless station 115 may transmit a first transmission 1205 to UE 105. UE 105 may receive first transmission 1205.

Returning to FIG. 10, channel conditions may be determined based on the received transmission signals (block 1010). Feedback processing unit 410 of UE 105 may perform channel estimations based on first transmission 1205. For example, feedback processing unit 410 may calculate SIR, SNR, SINR estimates, and/or other types of channel state information to determine channel conditions.

Feedback parameters may be determined based on the channel conditions (block 1015). For example, feedback processing unit 410 may determine feedback parameters based on the channel condition. As previously described, the feedback parameters may include, for example, a transmission property (e.g., transmission rank, number of carriers to transmit), CQIs, and/or other types of transmission characteristic information.

A feedback message may be generated that include the feedback parameters (block 1020). Feedback processing unit 410 may insert the feedback parameters into feedback message 900. For example, feedback processing unit 410 may generate feedback message 900 to include a transmission property value and corresponding CQIs (e.g., as previously described in FIG. 9B). Alternatively, feedback processing unit 410 may generate feedback message 900 to include CQIs for a plurality of transmission property values (e.g., as previously described in FIG. 9C).

The feedback message may be encoded with an unequal error protection code (block 1025). UEP encoder 415 of UE 105 may unequally error protect feedback message 900. For example, as previously described in connection with FIGS. 9A-9C, feedback message 900 may include M(0) through M(r_max) parts. In other implementations, feedback message 900 may have a variable length and the number of (M) parts may change, as previously described.

The distribution of the UEP may have a relationship between the placement and/or ordering of the feedback parameters in feedback message 900. Additionally, or alternatively, the level of error protection afforded to each parameter in feedback message 900 may be based on, for example, a transmission property. In one implementation, the distribution of the UEP may be fixed. For example, referring to FIG. 9B, the M parts may each have a fixed level of UEP regardless of their value. These concepts may be applied to a fixed or variable length feedback message 900.

The feedback message may be transmitted (block 1030). UE 105 may transmit feedback message 900 to wireless station 115 via MIMO transceiver 205, as illustrated in FIG. 12 by the transmission of a feedback message transmission 1210.

Although FIG. 10 illustrates an exemplary process 1000, in other implementations, fewer, additional, or different operations may be performed. For example, process 1000 may include determining information other than channel state information, such as precoding information, beamforming information, etc. Feedback message 900 may include this additional information.

FIG. 11 is a flow diagram illustrating an exemplary process 1100 that may be employed for performing link adaptation based on unequally error protected feedback message 900. Process 1100 may begin with receiving a feedback message (block 1105). For example, referring to FIG. 12, wireless station 115 may receive feedback message 900 via feedback message transmission 1210.

Returning to FIG. 11, the feedback message, encoded with a UEP code, may be decoded (block 1110). UEP decoder 815 of wireless station 115 may decode feedback message 900.

The feedback parameters in the feedback message may be interpreted (block 1120). Feedback processing unit 810 of wireless station 115 may interpret the feedback parameters contained in feedback message 900. Since the feedback parts included in feedback message 900 are coded with UEP, in one implementation, wireless station 115 may form an interpretation of the feedback message differently than existing schemes. For example, wireless station 115 may form an interpretation based on a weighting scale corresponding to the level of error protection. In this regard, the feedback parameters afforded with a higher level of error protection may be weighted more heavily than feedback parameters with a lower level of error protection. In instances where feedback message 900 includes M parts that do not have useful values, these parts may be ignored. In one implementation, feedback processing unit 810 may recognize M parts that do not have useful values based on the values themselves and/or the transmission rank.

A subsequent transmission may be adapted based on the interpretation of the feedback message (block 1125). Transmit processing unit 805 may adapt a subsequent transmission to UE 105 based on the interpretation of the feedback parameters contained in feedback message 900. For example, transmit processing unit 805 may employ adaptive modulation and coding (AMC) and/or other signal and protocol parameters to improve data throughput. For example, transmit processing unit 805 may select an appropriate modulation scheme, pre-coding scheme, etc., based on the feedback message 900.

The subsequent transmission may be transmitted (block 1130). Wireless station 115 may transmit the subsequent transmission to UE 105 via transceiver 605, as illustrated in FIG. 12 by the transmission of a second transmission 1215.

Although FIG. 11 illustrates an exemplary process 1100, in other implementations, fewer, additional, or different operations may be performed.

Unlike existing solutions, the concepts described herein exploit the connection between a transmission property, e.g., transmission rank, and the level of error protection applied to different parts of the feedback message. As a result, feedback parameters associated with a low transmission property value may be more protected from errors than additional feedback parameters that have a relationship with a higher transmission property value.

It will be appreciated that application of the concepts described herein may extend to other communication systems. For example, in a multi-carrier (MC) system, such as the extension to a WCDMA system, the number of carrier frequencies may correspond, by analogy, to the spatial layers in a MIMO system. Further, CQIs for different frequencies may correspond, by analogy, to CQIs for different spatial layers in the MIMO system. The number of carriers, as well as the number of spatial layers in a MIMO system (i.e. the transmission rank), are examples of a transmission property. Accordingly, in a MC system, it may advantageous due to system complexity or other reasons, to have the same control and/or feedback channels regardless of the number of scheduled carriers. The number of used carriers may be higher if the channel conditions are good and the number of used carriers may be lower if the channel conditions are poor. Hence, the feedback parts corresponding to the transmission on few carriers may need a higher level of error protection than the feedback parts corresponding to the transmission on many carriers.

Precoding is a popular technique used in conjunction with multi-antenna transmission. The basic idea is to mix and distribute the modulation symbols over the antennas while possibly taking the current channel conditions into account. This is often realized by multiplying the information carrying symbol vector by a matrix selected to match the channel. The symbol vector contains modulation symbols. Sequences of symbol vectors thus form a set of parallel symbol streams and each such symbol stream is referred to as a layer. Thus, depending on the precoder choice, a layer may directly correspond to a certain antenna or it may via the precoder mapping be distributed onto several antennas. Precoding is one of the key MIMO techniques in LTE. One of the most important characteristics of the channel conditions in the field of high rate multi-antenna transmission is the so-called channel rank. Roughly speaking, the channel rank can vary from one up to the minimum number of transmit and receive antennas, here denoted $r_{max}$. Taking a 4×2 system as an example, i.e., a system with four transmit antennas and two receive antennas, the maximum channel rank is thus two. The channel rank varies in time as the fast fading alters the channel coefficients. Moreover, it determines how many layers that can be successfully transmitted simultaneously. Hence, if the channel rank is one at the instant of transmission of two layers, there is a high likelihood that the two signals corresponding to the two layers will interfere so much that both of the layers are erroneously detected at the receiver.

In order to adapt the transmission to the varying channel conditions, the receiver may report (feed back) the effective channel quality on each layer to the transmitter by a Channel Quality Indicator (CQI). In a communication system that adapts the number of transmitted layers to the channel rank, the receiver reports CQI for a variable number of layers. In practice however, it is often not considered feasible to let the length of the feedback report vary with the channel conditions (note that a feedback report may contain other information than the CQIs, for instance the choice of a precoder matrix). Instead, bits are reserved in the feedback report for CQIs for the maximum number of layers, $r_{max}$.

In existing solutions with per-layer CQI, the feedback report always contains $r_{max}$ CQIs.

It should be noted that although terminology from 3GPP LTE has been used in this application to exemplify the invention, this should not be seen as limiting the scope of the invention to only the aforementioned system. Other wireless systems, including WCDMA, HSPA, WiMax, GSM, UMB, may also benefit from exploiting the ideas covered within this disclosure.

In existing solutions, the feedback report is channel encoded without taking into account that feedback messages needed for higher transmission ranks need less protection. Thus, the existing solutions do not exploit the connection between the transmission rank r and the need for error protection.

According to the invention, unequal error protection (UEP) channel codes is used in order to give higher error protection to the parts of feedback or control signaling that are more important when the path-loss is high (low SNR) or geometry is low. Similarly, the parts of the feedback that are more important when the path-loss is low (high SNR), or geometry high, are given lower error protection.

Using CQI reporting as an example of feedback, the invention enables strong CQI error protection when the number of requested layers is low and when it is likely that the path-loss is high by letting the information bits corresponding to r=1 have the highest protection. When r=1, the information bits corresponding to the CQIs of the unused layers do not carry any useful information. Errors on these bits therefore have no impact. With successively increasing r, the bits corresponding to the CQIs of the added layers are given successively lower error protection. By applying UEP coding, the average layer-CQI error probability may be minimized.

The use of a single CQI may occur also when the channel rank is greater than one. For instance, if large delay CDD or layer permutation is used in conjunction with a linear MIMO receiver, the effective CQIs for all used layers are identical, since the symbols from each layer are interleaved across all used spatial dimensions. But if a successive interference cancellation (SIC) type of receiver is used, the CQIs of subsequently decoded layers/codewords will increase. Thus there is a need for extra signaling bits for the support of SIC and those bits do not need as strong protection. This is an additional motivation for a higher error protection level for one of the CQIs.

The invention is not limited to UEP coding of CQIs for different layers. The UEP principle is valid also for other parameters that are reported per layer. Furthermore, the principle may be generalized beyond parameters connected to spatial layers.

Another example where the proposed invention may be used is in a multi-carrier (MC) system, such as an extension of the current WCDMA system to multiple carriers. In this case the number of carrier frequencies would have the same meaning as spatial layers in a MIMO system. The CQIs for the different frequencies will, in this MC case, correspond to the CQIs for different spatial layers in a MIMO setup. In such a MC system it may be advantageous, due to system complexity or other reasons, to have the same control or feedback channels regardless of the number of scheduled carriers. Hence, if less than the maximum number of carriers is scheduled, control information for non-scheduled carriers is not needed. Hence no (or very little) error protection would then be needed for those bits. By applying the principle described in this invention the same control channel structure can be maintained regardless of the number of used carriers.

Other objects, advantages and novel features of the invention will become apparent from the following detailed description of the invention.

This section describes in more detail a particular example of the use of the presented invention. It should however be noted that this does not limit the scope of the invention.

Let $r \leq r_{max}$ denote the number of layers the receiver feeds back information about. If $r=r_{max}$, the receiver requests/recommends full rank transmission. If $r=1$, the receiver requests single-layer transmission. Only r of the $r_{max}$ CQIs (assuming one CQI per layer, schemes with fewer CQI may also be used) in the feedback report contain useful information. It is a reasonable assumption that when r is high, the need for error protection is lower, than when r is low. This since when the receiver is closer to the transmitter (e.g. cell-center) feedback messages needed for higher transmission ranks need less protection. For example, multi-layered transmission (high transmission rank r) is more beneficial when the channel path-loss is low (high SNR) or geometry is high (including less interference). Single-layered transmission (r=1) is more likely when the path-loss is high (low SNR) or low geometry (including stronger interference), i.e. when the receiver is far away from the transmitter, often meaning on the cell-edge if a cellular system is considered. Given that the path-loss is reciprocal between the up- and downlink channels, the need for error protection of the feedback report is typically higher when r is low (low SNR). Similarly, the need for error protection of the feedback report is typically lower when r is high (high SNR).

Let $M_0$ denote the part of the feedback report that does not contain layer-specific information. Let A denote the number of information bits of $M_0$. Let $M_i$ denote the part of the feedback report that corresponds to the i:th layer ($1 \leq i \leq r_{max}$), more specifically the CQI of layer i. Let $M_i$ be $b_i$ bits and $B = \sum_{i=1}^{r_{max}} b_i$. In total, the feedback report contains $C=A+B$ information bits. We exemplify by assuming that A and B do not change with r. For practical reasons, all B bits are fed back, even though $r<r_{max}$. When $r<r_{max}$, the uncoded C-bit feedback message contains only $A+\sum_{i=1}^{r} b_i$ useful information bits, since $M_{r+1}, \ldots, M_{r_{max}}$ don't carry useful information. It doesn't matter if these unused bits are received erroneously. The C-bit feedback report is channel coded for error protection to D encoded bits.

In an existing solution, the feedback report is channel coded with equal error protection for all C information bits. For example, a "t-error correcting binary code" will decode the correct feedback report if t or fewer errors occur in the transmitted D-bit codeword. Hence, a problem with the existing equal-protection solutions is that when error protection is the most needed (e.g. high path-loss/geometry and typically low r), the unused $M_{r+1}, \ldots, M_{r_{max}}$ are encoded for the same level of protection as the used $M_0, \ldots, M_r$.

To improve the overall CQI error performance, unequal error protection (UEP) codes are used. UEP codes are well known and studied in literature, see for example Masnick, B., Wolf, J., "On linear unequal error protection codes", IEEE Transactions on Information Theory, vol. 3, no. 4, pp. 600-607, October 1967, and Boyarinov, I. M., Katsman, G. L., "Linear unequal error protection codes", IEEE Transactions on Information Theory, vol. 37, no. 2, pp. 168-175, March 1981, and will therefore not be presented in any detail here. Briefly, UEP codes enable unequal error protection characteristics to different digits in the information word $[M_0 \ldots M_{r_{max}}]$.

Referring back, FIG. 9A illustrates the principle of an application of the invention. The $C=A+\Sigma b_i$ information bits long feedback report is encoded so that for example $f_1 > \ldots > f_{r_{max}}$, where $f_i$ is the error protection level of $M_i$. A higher error protection level means that the information bits are more likely to be decoded correctly when random errors occur in the D-bit codeword. Depending on the content of $M_0$, $f_0$ can be higher or lower than $f_1$. However, $f_0$ should be greater than $f_2$.

The feedback report is constrained to C uncoded bits and D encoded bits. The invention distributes the error protection between the low transmission rank r and high transmission rank r cases so that the useful information for low r is more protected than the additional information that is transmitted when r is high. This is motivated by the connection between low transmission rank r and higher need for error protection. In a more general context, the advantage of the invention is the ability to exploit the fact that certain parts of the feedback message are typically useful primarily for higher geometry/lower path losses where the conditions for the reverse link channel carrying the feedback message tend to be better as well.

The present invention may, of course, be carried out in other ways than those specifically set forth herein without departing from essential characteristics of the invention. The present embodiments are to be considered in all respects as illustrative and not restrictive.

The foregoing description of implementations provides illustration, but is not intended to be exhaustive or to limit the implementations to the precise form disclosed. Modifications and variations are possible in light of the above teachings or may be acquired from practice of the teachings.

In addition, while series of blocks have been described with regard to processes illustrated in FIGS. 10 and 11, the order of the blocks may be modified in other implementations. Further, non-dependent blocks may be performed in parallel. Further, one or more blocks may be omitted. It is also to be understood that the processes illustrated in FIGS.

10 and 11 and/or other processes described herein, may be performed based on instructions stored on a computer-readable medium.

It will be apparent that aspects described herein may be implemented in many different forms of software, firmware, and hardware in the implementations illustrated in the figures. The actual software code or specialized control hardware used to implement aspects does not limit the invention. Thus, the operation and behavior of the aspects were described without reference to the specific software code—it being understood that software and control hardware can be designed to implement the aspects based on the description herein.

Even though particular combinations of features are recited in the claims and/or disclosed in the specification, these combinations are not intended to limit the invention. In fact, many of these features may be combined in ways not specifically recited in the claims and/or disclosed in the specification.

It should be emphasized that the term "comprises" or "comprising" when used in the specification is taken to specify the presence of stated features, integers, steps, or components but does not preclude the presence or addition of one or more other features, integers, steps, components, or groups thereof.

No element, act, or instruction used in the present application should be construed as critical or essential to the implementations described herein unless explicitly described as such.

What is claimed is:

1. A method for providing feedback information, the method comprising:
    receiving, at a user equipment (UE), a transmission;
    generating, at the UE, a feedback message based on the transmission, the feedback message comprising a first section and a second section,
        wherein the feedback message comprises an ordered set of feedback parts, with each feedback part comprising a value representing a level of link adaptation utility associated with a respective transmission property of the transmission,
        wherein the respective transmission property is capable of having a range of transmission property values,
        wherein the ordered set of feedback parts are defined such that a lowest value in the range of transmission property values for each of the feedback parts, except a first feedback part in the ordered set of feedback parts, is greater than a lowest value in the range of transmission property values of a preceding feedback part in the ordered set, and
        wherein a greater transmission property value represents a lower path loss for a potential transmission than a lower transmission property value that represents a higher path loss for the potential transmission;
    generating, at the UE, the first section of the feedback message by:
        determining a first rank for the first section of the transmission,
        determining a first level of error protection based on the first rank, and
        encoding the first section of the transmission based on the first level of error protection;
    generating, at the UE, the second section of the feedback message by:
        determining a second rank for the second section of the transmission,
        determining a second level of error protection based on the second rank, and
        encoding the second section of the transmission based on the second level of error protection,
            wherein the first level of error protection is different than the second level of error protection; and
    transmitting the encoded feedback message.

2. The method of claim 1, where the UE comprises a multiple-input multiple-output receiver.

3. The method of claim 1, where the feedback message has a fixed length including a fixed number of feedback parts belonging to the ordered set.

4. The method of claim 1, wherein the feedback message comprises at least one channel quality indicator.

5. The method of claim 4, wherein the at least one channel quality indicator is associated with at least one transmission property.

6. The method of claim 1, wherein the feedback message comprises one of a transmission rank or a number of carrier frequencies.

7. The method of claim 1, wherein the feedback message comprises a single transmission property value of the range of transmission property values.

8. The method of claim 7, wherein, if the single transmission property value corresponds to a maximum transmission property value, a last feedback part of the one or more feedback parts of the ordered set of feedback parts has a lowest level of error protection.

9. The method of claim 1, wherein the feedback message comprises at least one feedback parameter.

10. The method of claim 1, wherein at least one of the feedback parts of the ordered set of feedback parts comprises a channel quality indicator (CQI).

11. The method of claim 10, wherein the CQI comprises a CQI associated with a layer of a Multiple-Input Multiple-Output (MIMO) communication system.

12. The method of claim 1, wherein the range of transmission property values comprises a range up to a maximum transmission property value.

13. The method of claim 1, where each value of the ordered set of feedback parts is associated with a different transmission property value in the range of transmission property values.

* * * * *